(12) United States Patent
Hosseini et al.

(10) Patent No.: US 9,406,646 B2
(45) Date of Patent: Aug. 2, 2016

(54) ELECTRONIC DEVICE AND METHOD FOR FABRICATING AN ELECTRONIC DEVICE

(75) Inventors: Khalil Hosseini, Weihmichl (DE); Frank Kahlmann, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 72 days.

(21) Appl. No.: 13/282,927

(22) Filed: Oct. 27, 2011

(65) Prior Publication Data

US 2013/0105977 A1    May 2, 2013

(51) Int. Cl.
| | | |
|---|---|---|
| H01L 23/48 | (2006.01) | |
| H01L 23/00 | (2006.01) | |
| H01L 23/29 | (2006.01) | |
| H01L 23/31 | (2006.01) | |
| H01L 21/56 | (2006.01) | |
| H01L 29/40 | (2006.01) | |
| H01L 23/552 | (2006.01) | |

(52) U.S. Cl.
CPC .............. *H01L 24/97* (2013.01); *H01L 21/561* (2013.01); *H01L 23/291* (2013.01); *H01L 23/3185* (2013.01); *H01L 24/03* (2013.01); *H01L 24/05* (2013.01); *H01L 24/06* (2013.01); *H01L 29/402* (2013.01); *H01L 23/552* (2013.01); *H01L 2221/68359* (2013.01); *H01L 2224/0233* (2013.01); *H01L 2224/0239* (2013.01); *H01L 2224/02371* (2013.01); *H01L 2224/03002* (2013.01); *H01L 2224/034* (2013.01); *H01L 2224/03848* (2013.01); *H01L 2224/0556* (2013.01); *H01L 2224/0612* (2013.01); *H01L 2224/97* (2013.01); *H01L 2924/1305* (2013.01); *H01L 2924/13055* (2013.01); *H01L 2924/13091* (2013.01); *H01L 2924/1461* (2013.01)

(58) Field of Classification Search
USPC ............ 257/777, E23.023, E21.511; 438/109
See application file for complete search history.

(56) References Cited

U.S. PATENT DOCUMENTS

| | | | | |
|---|---|---|---|---|
| 4,320,251 | A * | 3/1982 | Narasimhan et al. | 136/256 |
| 4,424,408 | A * | 1/1984 | Elarde | H05K 1/09 |
| | | | | 174/110 N |
| 4,633,573 | A * | 1/1987 | Scherer | 29/841 |
| 6,197,619 | B1 * | 3/2001 | Gaynes | H01L 21/563 |
| | | | | 257/E21.503 |
| 6,312,975 | B1 * | 11/2001 | Brechignac et al. | 438/112 |
| 6,403,988 | B2 * | 6/2002 | Iida et al. | 257/139 |
| 7,220,617 | B2 * | 5/2007 | Kagii et al. | 438/106 |
| 7,259,041 | B2 * | 8/2007 | Stelzl et al. | 438/106 |
| 7,378,741 | B2 | 5/2008 | Mauder | |
| 7,767,495 | B2 | 8/2010 | Fuergut et al. | |
| 7,772,693 | B2 | 8/2010 | Koller et al. | |
| 8,232,636 | B2 * | 7/2012 | Humenik et al. | 257/707 |
| 8,410,600 | B2 | 4/2013 | Lostetter et al. | |
| 8,426,960 | B2 * | 4/2013 | Sun et al. | 257/691 |

(Continued)

FOREIGN PATENT DOCUMENTS

| | | |
|---|---|---|
| DE | 10351028 A1 | 6/2005 |
| DE | 102004047357 A1 | 4/2006 |

(Continued)

*Primary Examiner* — Bradley K Smith
*Assistant Examiner* — David Goodwin
(74) *Attorney, Agent, or Firm* — Slater & Matsil, L.L.P.

(57) ABSTRACT

An embodiment electronic device comprises a semiconductor chip including a first main face, a second main face and side faces each connecting the first main face to the second main face. A metal layer is disposed above the second main face and the side faces, the metal layer including a porous structure.

12 Claims, 7 Drawing Sheets

(56) References Cited

U.S. PATENT DOCUMENTS

| | | | |
|---|---|---|---|
| 2002/0056473 A1 | 5/2002 | Chandra et al. | |
| 2004/0262678 A1* | 12/2004 | Nakazawa et al. | 257/330 |
| 2006/0175700 A1* | 8/2006 | Kagii | H01L 21/52 257/706 |
| 2007/0228519 A1* | 10/2007 | Miyoshi et al. | 257/551 |
| 2008/0191359 A1* | 8/2008 | Koller | H01L 257/3114 257/773 |
| 2008/0283999 A1* | 11/2008 | Tosaya et al. | 257/697 |
| 2009/0096100 A1 | 4/2009 | Kajiwara et al. | |
| 2009/0160045 A1* | 6/2009 | Sun | H01L 21/568 257/699 |
| 2009/0321955 A1* | 12/2009 | Houle | H01L 21/4867 257/777 |
| 2010/0108952 A1* | 5/2010 | Shim et al. | 252/512 |
| 2011/0175209 A1* | 7/2011 | Seddon et al. | 257/659 |
| 2011/0267673 A1* | 11/2011 | Agrawal et al. | 359/267 |
| 2011/0318213 A1* | 12/2011 | Handwerker et al. | 419/10 |

FOREIGN PATENT DOCUMENTS

| | | |
|---|---|---|
| DE | 102007029422 A1 | 2/2009 |
| DE | 102007041926 A1 | 3/2009 |
| DE | 102009038702 A1 | 4/2010 |
| DE | 112010003891(T5) | 11/2012 |

* cited by examiner

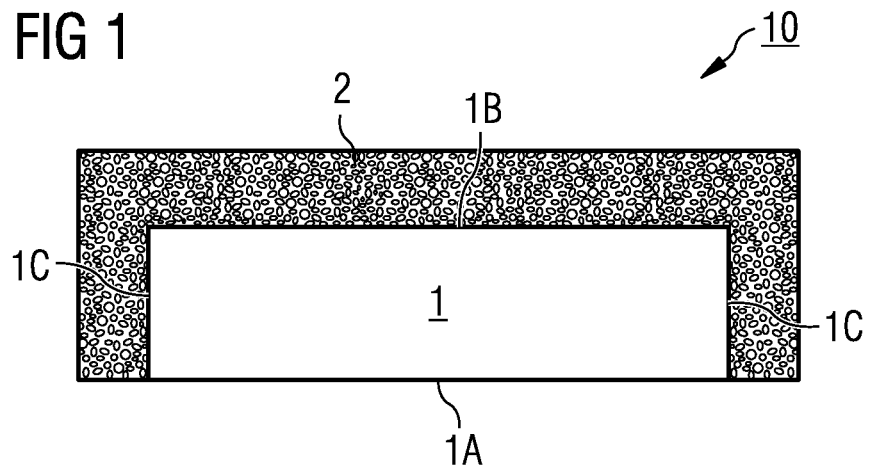
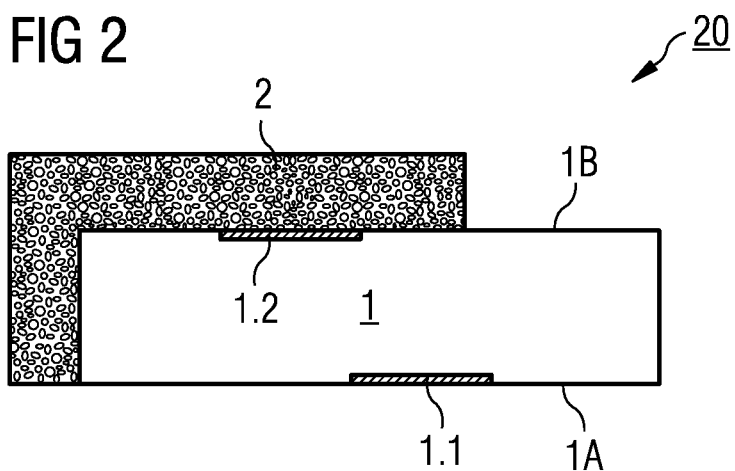
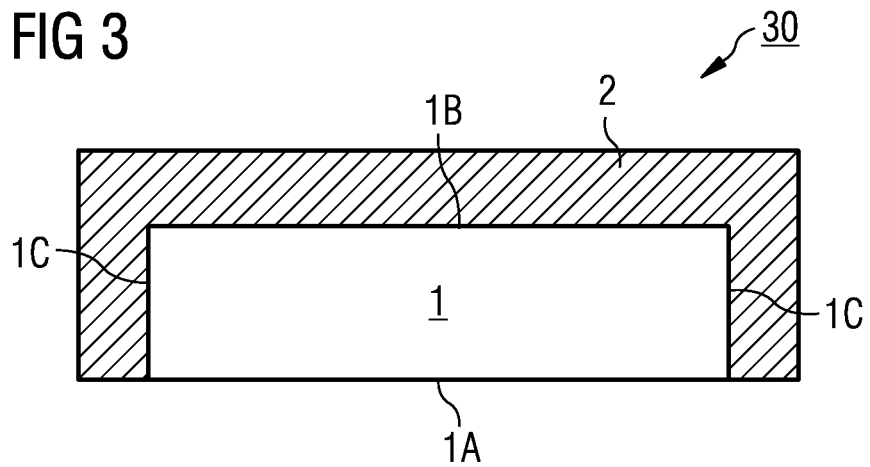

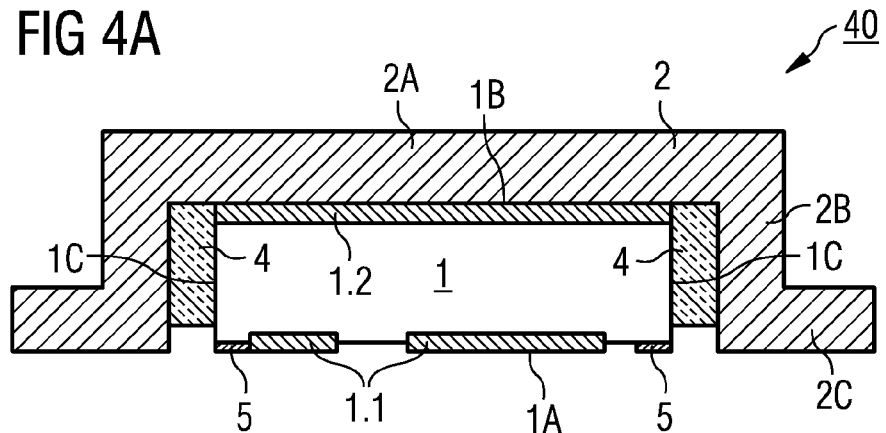
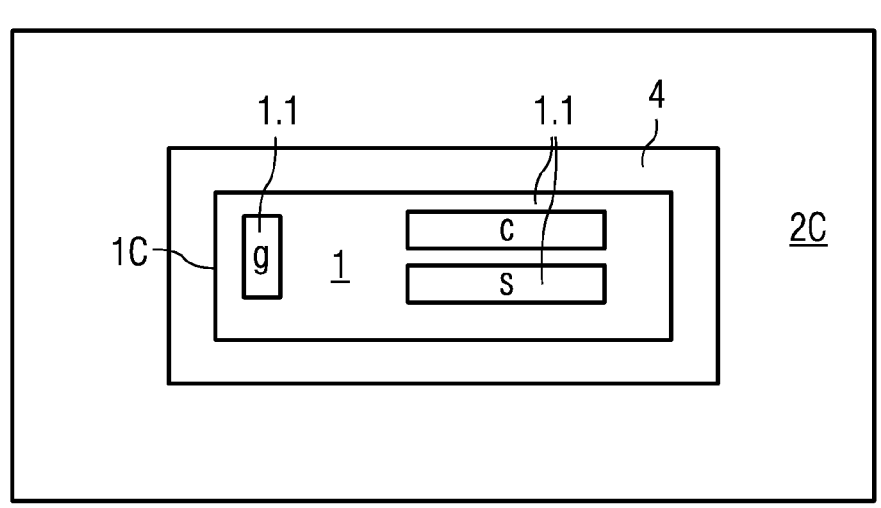
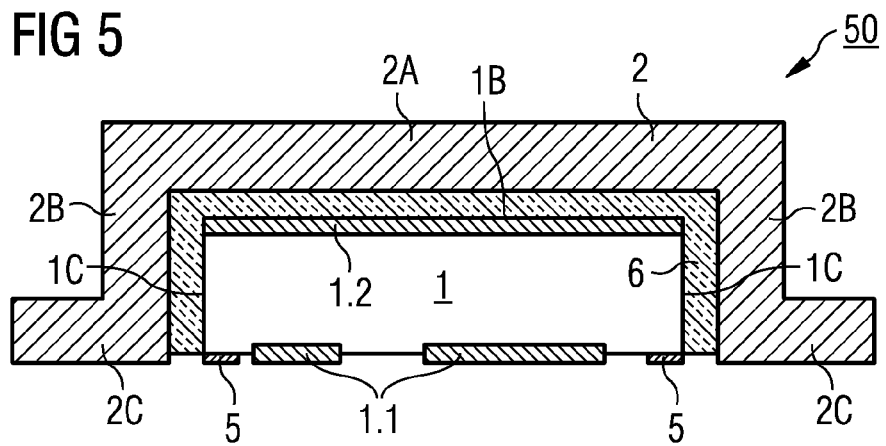

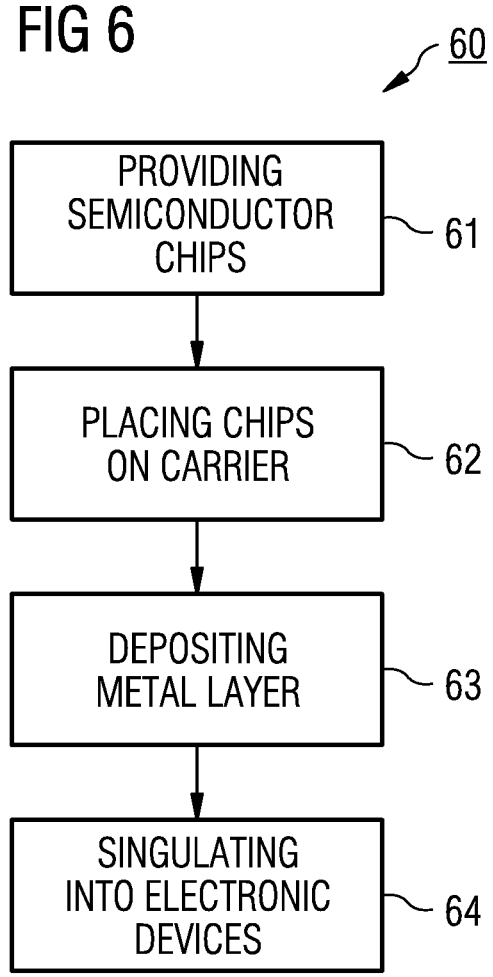

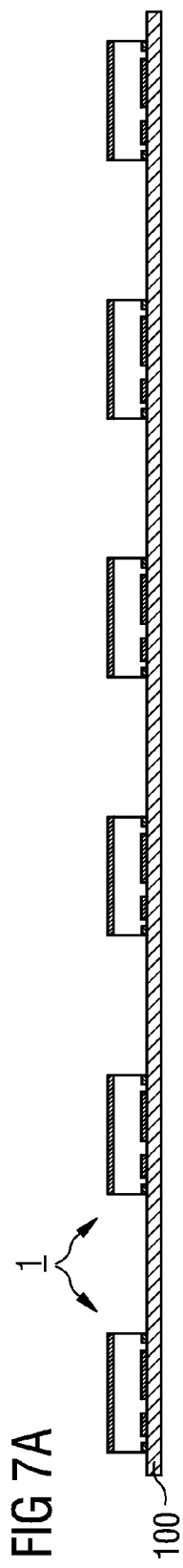
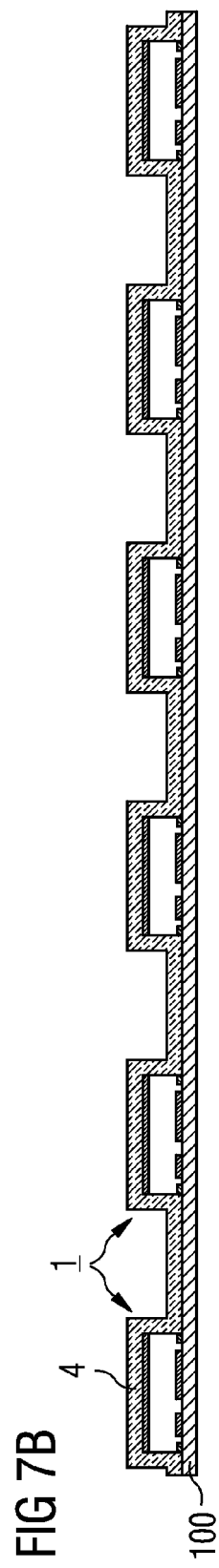
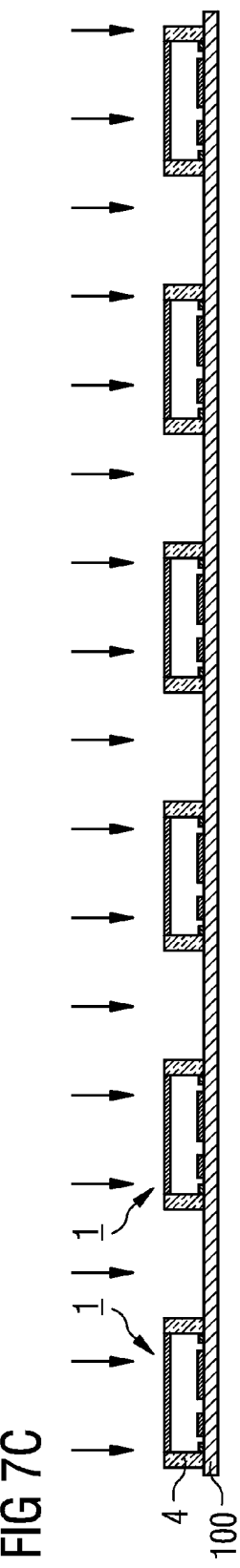
FIG 7A
FIG 7B
FIG 7C

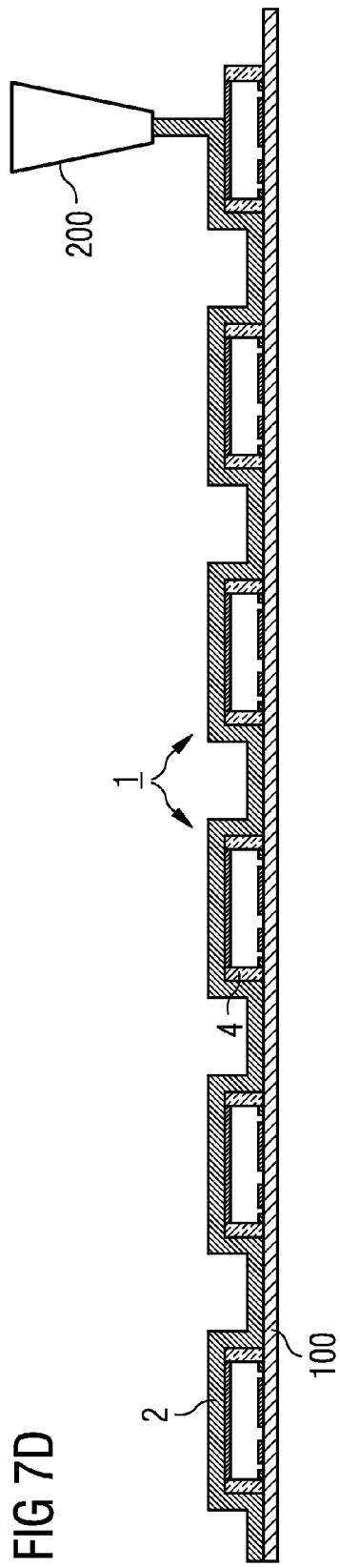
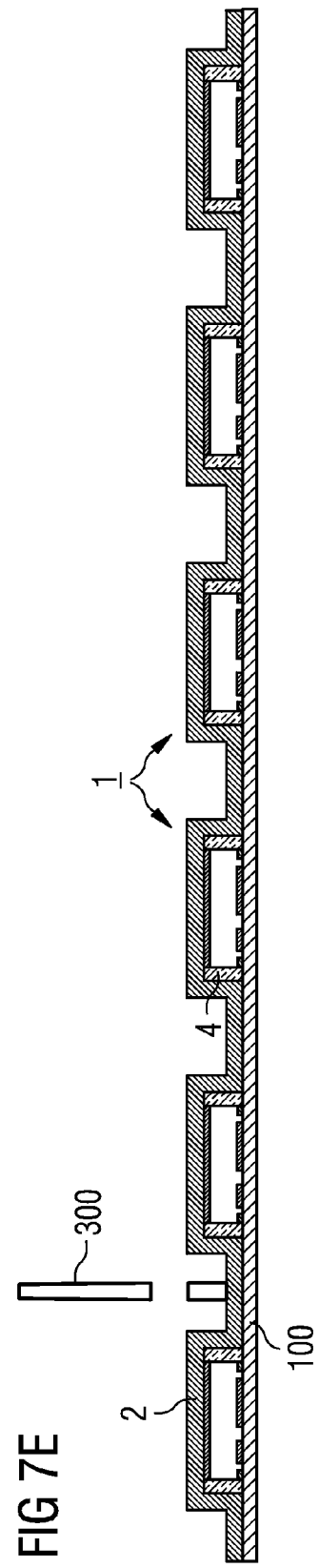
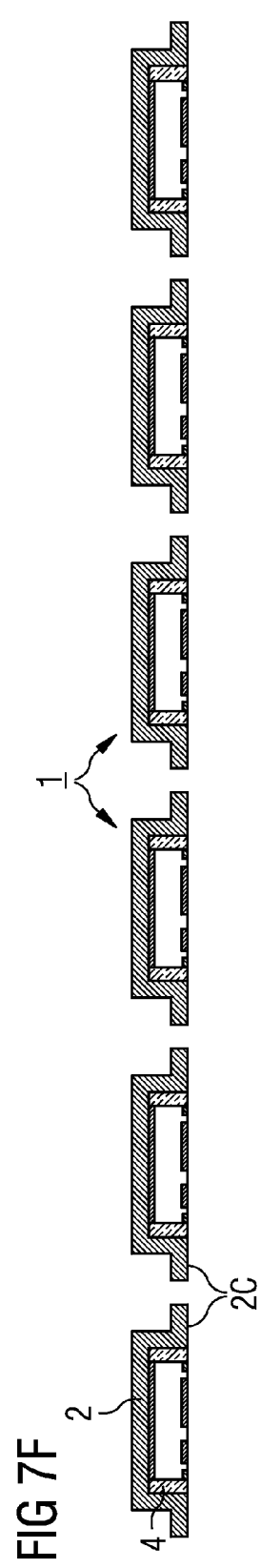
FIG 7D
FIG 7E
FIG 7F

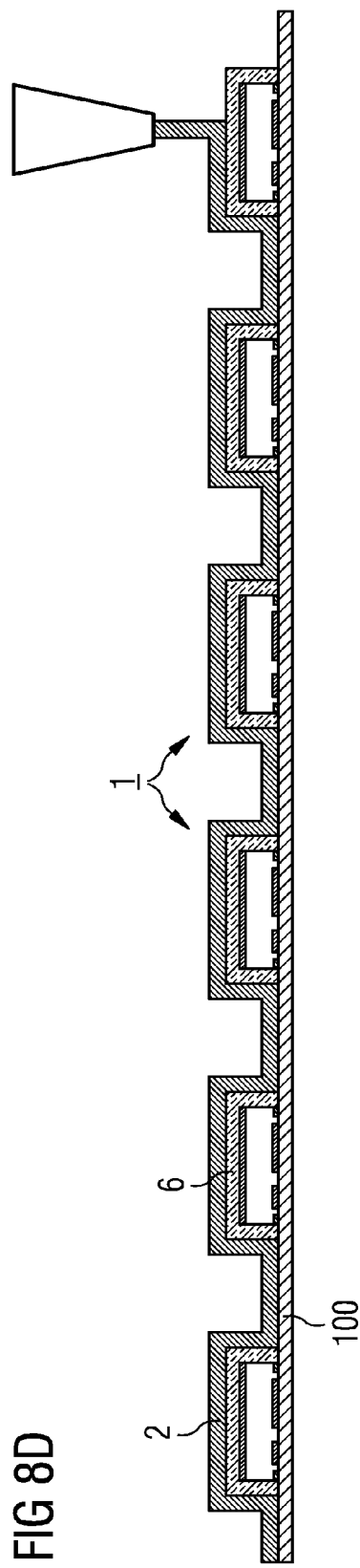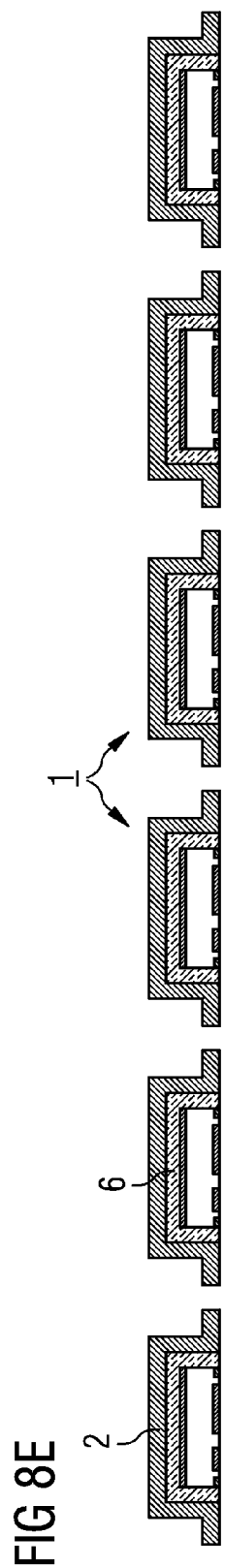

ELECTRONIC DEVICE AND METHOD FOR FABRICATING AN ELECTRONIC DEVICE

TECHNICAL FIELD

The present invention relates to an electronic device and a method for fabricating an electronic device.

BACKGROUND

In an electronic device a semiconductor chip is arranged and contact elements of the semiconductor chip can be arranged on both main surfaces of the semiconductor chip. One or more of the contact elements of the semiconductor chip have to be connected with external electrical contact areas of the electronic device so that the electronic device can be arranged on an electronic board like, for example, a printed circuit board (PCB).

SUMMARY OF THE INVENTION

An embodiment electronic device has a semiconductor chip with a first main face, a second main face and side faces each connecting the first main face to the second main face. A metal layer is disposed above the second main face and the side faces. The metal layer has a porous structure.

An embodiment electronic device has a semiconductor chip with a first contact element on a first main face and a second contact element on a second main face. A porous metal layer is disposed on the second contact element and extends up to a plane of the first main face.

An embodiment electronic device has a semiconductor chip with a first main face, a second main face and side faces each connecting the first main face to the second main face. A plasmadust fabricated metal layer is disposed above the second main face and the side faces.

An embodiment electronic device has a semiconductor chip with a first main face, a second main face and side faces each connecting the first main face to the second main face. A metal layer is disposed above the second main face and the side faces. The metal layer has one or more of a homogeneous material composition and an almost equal thickness on the second face and the side faces.

An embodiment method for fabricating an electronic device provides a plurality of semiconductor chips. The semiconductor chips each comprise a first main face, a second main face and side faces each connecting the first main face to the second main face. The semiconductor chips are placed on a carrier with the first main face facing the carrier. A metal layer is deposited above the second main face and the side faces. The carrier is singulated into a plurality of electronic devices.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 shows a schematic cross-sectional side view representation of an electronic device according to an embodiment;

FIG. 2 shows a schematic cross-sectional side view representation of an electronic device according to an embodiment;

FIG. 3 shows a schematic cross-sectional side view representation of an electronic device according to an embodiment;

FIGS. 4A and 4B show a schematic cross-sectional side view representation (FIG. 4A) and a bottom view representation (FIG. 4B) of an electronic device according to an embodiment;

FIG. 5 shows a schematic cross-sectional side view representation of an electronic device according to an embodiment;

FIG. 6 shows a flow diagram for illustrating a method for fabricating an electronic device according to an embodiment;

FIGS. 7A-7F show schematic cross-sectional side view representations for illustrating a method for fabricating an electronic device; and FIGS. 8A-8E show schematic cross-sectional side view representations for illustrating a method for fabricating an electronic device.

DETAILED DESCRIPTION OF ILLUSTRATIVE EMBODIMENTS

Figure 8A:
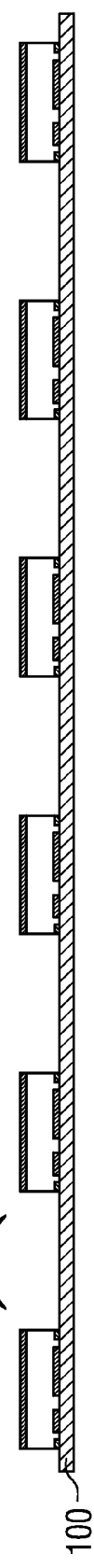

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless of whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic device and a method for fabricating an electronic device may use various types of semiconductor chips or circuits incorporated in the semiconductor chips, among them logic integrated circuits, analog integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

In several embodiments, layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor package. The contact elements or contact pads may be made from any electrically conducting material, e.g., from a metal such as aluminum, gold, or copper, for example, or a metal alloy, or an electrically conducting organic material, or an electrically conducting semiconductor material.

In the claims and in the following description different embodiments of a method for fabricating an electronic device are described as a particular sequence of processes or measures, in particular in the flow diagrams. It is to be noted that the embodiments should not be limited to the particular sequence described. Particular ones or all of the different processes or measures can also be conducted simultaneously or in any other useful and appropriate sequence.

Referring to FIG. 1, there is shown a schematic cross-sectional side view representation of an electronic device according to an embodiment. The electronic device 10 according to FIG. 1 comprises a semiconductor chip 1 comprising a first main face 1A, a second main face 1B and side faces 1C each connecting the first main face 1A to the second main face 1B. The electronic device 10 further comprises a metal layer 2 disposed above the second main face 1B and the side faces 1C, the metal layer 2 comprising a porous structure.

According to an embodiment of the electronic device 10, the semiconductor chip 1 is of conventional shape comprising four side faces 1C and the metal layer 2 is disposed above all four side faces 1C.

According to an embodiment of the electronic device 10, the metal layer 2 is disposed on the side faces 1C in such a way that it extends from the second main face 1B down to a plane of the first main face 1A.

According to an embodiment of the electronic device 10, the semiconductor chip 1 comprises a vertical transistor structure. Consequently the semiconductor chip 1 comprises at least one first contact element on the first main face 1A and at least one second contact element on the second main face 1B. The metal layer 2 stays in electrical contact with the second contact element on the second main face 1B.

According to an embodiment of the electronic device 10 of FIG. 1, the electronic device further comprises an interdiffusion prevention layer disposed between the side faces and the metal layer 2, the interdiffusion prevention layer being adapted to prevent interdiffusion between atoms of the semiconductor chip 1 and the metal layer 2. Alternatively or in addition thereto, an interdiffusion prevention layer can also be disposed between the second main face 1B and the metal layer 2. In this case, however, the interdiffusion prevention layer should be preferably electrically conductive in order to establish electrical contact between the second contact element and the metal layer.

According to an embodiment of the electronic device 10, the metal layer 2 comprises almost equal thickness on the second main face 1B and the side faces 1C. According to an embodiment the thickness can be in a range from 50 µm to 250 µm.

According to an embodiment of the electronic device 10, the semiconductor chip 1 comprises a thickness, i.e., a height between the first main face 1A and the second main face 1B less than 100 µm.

According to an embodiment of the electronic device 10, the metal layer 2 can be fabricated by a plasmadust method.

According to an embodiment of the electronic device 10, the porosity of the metal layer 2 is such that it contains a plurality of voids and the metal layer 2 has a porosity in the range of 2% to 40%.

According to an embodiment of the electronic device 10, the metal layer 2 is made of elementary copper or an alloy of copper with at least one other element or metal. It is also possible that the metal layer 2 is essentially based on copper but includes small amounts of any sort of element or metal or core-shell material with Cu as core and precious metal for the shell.

According to an embodiment of the electronic device 10, the metal layer 2 comprises an upper horizontal portion disposed above the second main face 1B, a vertical portion disposed above the side faces 1C, and a lower horizontal portion extending in the plane of the first main face 1A. A specific embodiment thereof will be shown later. In particular, this embodiment can be such that one or more of the vertical portion and the lower horizontal portion are shaped in the form of a closed ring which surrounds the semiconductor chip 1.

According to an embodiment of the electronic device 10, the electronic device 10 further comprises a ring-shaped field-limiting layer disposed above an edge of the first main face 1A of the semiconductor chip 1. An embodiment thereof will be shown later.

Referring to FIG. 2, there is shown a schematic cross-sectional side view representation of an electronic device according to an embodiment. The electronic device 20 of FIG. 2 comprises a semiconductor chip 1 having a first contact element 1.1 on a first main face 1A and a second contact element 1.2 on a second main face 1B. The electronic device 20 further comprises a porous metal layer 2 disposed on the second contact element 1.2 and extending to a plane of the first main face 1A.

According to an embodiment of the electronic device 20, the electronic device 20 further comprises a ring-shaped interdiffusion prevention layer disposed between the second main face 1B and the metal layer 2.

According to an embodiment of the electronic device 20, the electronic device 20 further comprises a ring-shaped field-limiting layer disposed above an edge of the first main face 1A of the semiconductor chip 1.

Further embodiments of the electronic device 20 can be formed with any one of the features and embodiments as described above in connection with the electronic device 10 of FIG. 2.

Referring to FIG. 3, there is shown a schematic cross-sectional side view representation of an electronic device according to an embodiment. The electronic device 30 of FIG. 3 comprises a semiconductor chip 1 comprising a first main face 1A, a second main face 1B and side faces 1C each connecting the first main face 1A to the second main face 1B. The electronic device 30 further comprises a metal layer 2 disposed above the second main face 1B and the side faces 1C, the metal layer 2 comprising one or more of a homogeneous material composition and an almost equal thickness on the second face 1B and the side faces 1C.

According to an embodiment of the electronic device 30, the metal layer 2 comprises a lower horizontal portion extending in the plane of the first main face 1A.

According to an embodiment of the electronic device 30, the electronic device 30 further comprises an interdiffusion prevention layer disposed between the side faces 1C and the metal layer 2, the interdiffusion prevention layer being adapted to prevent interdiffusion between atoms of the semiconductor chip 1 and the metal layer 2. Alternatively or in addition thereto, an interdiffusion prevention layer can also be disposed between the second main face 1B and the metal layer 2.

Referring to FIGS. 4A and 4B, there is shown a schematic cross-sectional side view representation (FIG. 4A) and a bottom view representation (FIG. 4B) of an electronic device according to an embodiment. The electronic device 40 of FIGS. 4A and 4B comprises a semiconductor chip 1 comprising a first main face 1A, a second main face 1B and side faces 1C each connecting the first main face 1A to the second main face 1B. The electronic device 40 further comprises a metal layer 2 disposed above the second main face 1B and the side faces 1C, the metal layer 2 comprising a porous structure. The metal layer 2 is disposed above all four side faces 1C of the semiconductor chip 1. The semiconductor chip comprises first contact elements 1.1 on the first main face 1A and a second contact element 1.2 on the second main face 1B. The second contact element 1.2 is electrically connected with the metal layer 2. The electronic device 40 further comprises an interdiffusion prevention layer 4 disposed between the side face 1C and the metal layer 2 for preventing interdiffusion between atoms of the semiconductor chip 1 and the metal layer 2. The interdiffusion prevention layer 4 can, for example, be comprised of an electrically insulating layer made of silicon dioxide ($SiO_2$). The metal layer 2 comprises an upper horizontal portion 2A situated above the second main face 1B of the semiconductor chip 1, vertical portions 2B disposed above the side face 1C, and a lower horizontal portion 2C a lower surface of which is coplanar with the first main face 1A of the semiconductor chip 1. The metal layer 2 is fabricated, for example, by a plasmadust method which yields a porous structure comprising a plurality of voids uniformly distributed throughout the metal layer 2 and the metal layer 2 has a porosity in a range of 2% to 40%. The electronic device 40 further comprises a ring-shaped field-limiting layer 5 disposed above an edge of the first main face 1A of the semiconductor chip 1. The layer 5 serves to shield the electrical field emanating from the first contact elements 1.1 to the outside. A lower surface of the layer 5 and a lower surface of the layer 4 are arranged at a similar level or at a similar height. The thickness of the metal layer 2 preferably constant along all portions 2A-2C of the metal layer 2 and ranges from 50 μm to 250 μm.

The semiconductor chip 2 comprises, for example, a vertical transistor structure wherein the first contact elements 1.1 are comprised of the gate contact element and the source contact element and the second contact element 1.2 is comprised of the drain contact element.

As can be seen in FIG. 4B, the lower horizontal portion 2C of the metal layer 2 is configured in a ring-like form surrounding the semiconductor chip 1. Also the interdiffusion prevention layer 4 is disposed on each one of the side faces 1C of the semiconductor chip 1 so that it also surrounds the semiconductor chip 1 in a ring-like manner. The field-limiting layer 5 has the form of a thin bar disposed on the first main face 1A of the semiconductor chip 1 and running parallel to and adjacent to the edges of the first main face 1A. The first contact elements 1.1 are comprised of a gate contact element (g), a source contact element (c), and a so-called source sense element (s).

Referring to FIG. 5, there is shown a schematic cross-sectional side view representation of an electronic device according to an embodiment. The electronic device 50 comprises a similar structure as the electronic device 40 of FIGS. 4A and 4B so that in the following only those features will be described which differ over the electronic device 40 of FIGS. 4A,B. It was shown that the electronic device 40 comprises an interdiffusion prevention layer 4 disposed on the side faces 1C of the semiconductor chip 1. In contrast to this the electronic device 50 of FIG. 5 comprises an interdiffusion prevention layer 6 disposed between the second main face 1B and the metal layer 2 and between the side faces 1C and the metal layer 2. The interdiffusion prevention layer 6 can be comprised of an electrically conductive barrier layer made of a single titanium (Ti) layer or a layer stack comprised of two or more layers of Ti and a Ti alloy like TiW. The interdiffusion prevention layer 6 is electrically conductive so that it can be also disposed between the second contact element 1.2 and the metal layer 2. Similar to the interdiffusion prevention layer 4 of the electronic device 40, the interdiffusion prevention layer 6 of the electronic device 50 is adapted to prevent interdiffusion between atoms of the semiconductor chip 1 and the metal layer 2. The interdiffusion prevention layer 6 is also disposed on all four side faces 1C of the semiconductor chip 1. In FIG. 5, a lower surface of the layer 5 and a lower surface of the layer 6 are illustrated to be coplanar or almost coplanar. However, it is understood that the lower surface of the layer 5 and the lower surface of the layer 6 may also be arranged at a similar level or at a similar height.

Referring to FIG. 6, there is shown a flow diagram for illustrating a method for fabricating an electronic device according to an embodiment. The method 60 of FIG. 6 comprises providing a plurality of semiconductor chips (61), the semiconductor chips each comprising a first main face, a second main face and side faces each connecting the first main face to the second main face, placing the semiconductor chips on a carrier with the first main face facing the carrier (62), depositing a metal layer above the second main face and the side faces (63), and singulating into a plurality of electronic device (64).

According to an embodiment of the method 60, depositing the metal layer is performed in a single step.

According to an embodiment of the method 60, depositing the metal layer is performed by a plasmadust method.

According to an embodiment of the method 60, the metal layer is deposited in the form of a porous metal layer. According to an embodiment of the method 60, the metal layer is deposited with equal thickness on the second main face and the side faces.

According to an embodiment of the method 60, an interdiffusion prevention layer is deposited between one or more of the second main face and the metal layer, and the side faces and the metal layer. The interdiffusion prevention layer is adapted to prevent interdiffusion between atoms of the semiconductor chip and the metal layer.

According to an embodiment of the method 60, a field-limiting layer is deposited on the first main face of the semiconductor chip.

According to an embodiment of the method 60, the metal layer is deposited to a thickness in a range from 50 μm to 250 μm.

According to an embodiment of the method 60, after depositing the metal layer an annealing step is carried out, in particular for a time duration of 0.5 h and a temperature in a range of 200° C.-450° C.

According to an embodiment of the method 60, depositing the metal layer is performed in such a way that intermediate spaces between the semiconductor chips are also deposited with the metal layer. As a consequence, when singulating the panel into a plurality of electronic devices, each one of the electronic devices comprises lower horizontal portions of the metal layer surrounding the semiconductor chip in a ring-like manner.

Referring to FIGS. 7A-7E, there are shown schematic cross-sectional side view representations for illustrating a method for fabricating an electronic device according to an embodiment. FIG. 7A shows a carrier 100, for example, made of or including a metal, having a double-sided adhesive tape thereupon so that a plurality of semiconductor chips 1 can be fixedly placed on the carrier 100. The semiconductor chips 1 each comprise vertical transistor structures and are pre-fabricated each with a field-limiting layer 6 as described above.

FIG. 7B shows the arrangement after coating with a dielectric material, e.g., $SiO_2$, by any deposition method known in the art like, for example, chemical vapor deposition (CVD), plasmadust method, or any sort of lamination method. The thickness of the thus fabricated interdiffusion prevention layer 4 is in a range from 100 nm to 5 μm, in particular 1 μm to 2 μm. As can be seen, the dielectric material is coated also on intermediate spaces between the semiconductor chips 1.

FIG. 7C shows the arrangement after carrying out an anisotropic etching of the dielectric coating so that the dielectric layer 4 only remains on the side walls 1C of the semiconductor chips 1.

FIG. 7D shows the arrangement after coating with metallic powder or core-shell material with plasmadust technology. The metallic powder can be accelerated together with a plasma gas, in particular an ionized argon plasma and directed onto the upper surface of the arrangement by means of a plasmadust head 200 which is scanned over the upper surface of the arrangement in a line-by-line manner. The coating is performed such that a thickness of the obtained metallic layer 2 is in a range from 50 μm to 250 μm. It can be seen that the metal layer 2 is deposited also on the intermediate spaces between the semiconductor chips 1. Thereafter an annealing or tempering of the metallic layer 2 is carried out for 0.5 h at 200° C. to 450° C.

Referring to FIG. 7E, there is illustrated the step of dicing or sawing the obtained panel into a plurality of electronic devices. This can be performed by means of a saw 300 which continuously removes the material of the metal layer 2 until it reaches the upper surface of the carrier 100 along sawing streets forming a grid pattern so that each one of the electronic devices are separated from each other by the sawing streets. The sawing streets are sufficiently narrow so that the electronic devices are fabricated each one with a lower horizontal portion 2C of the metal layer 2.

Referring to FIG. 7F there are shown multiple electronic devices obtained after releasing the electronic devices from the carrier 100.

Figure 8B:
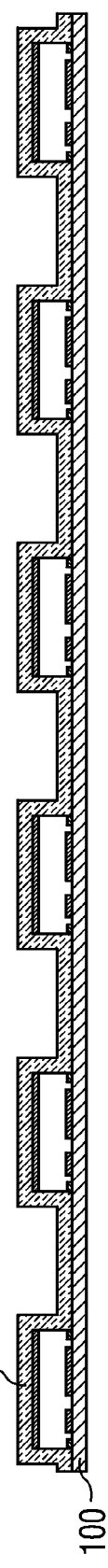
Figure 8C:
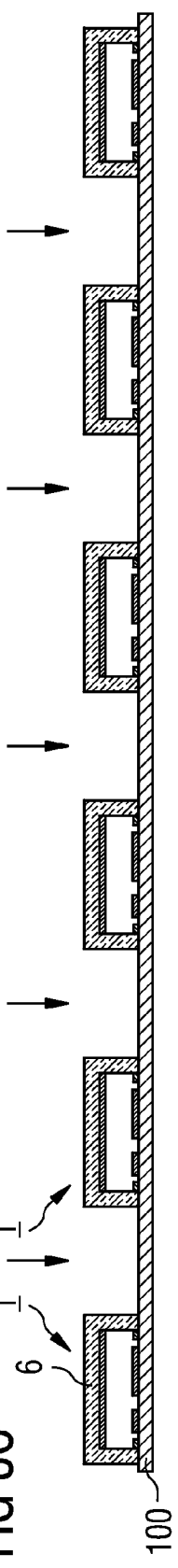

Referring to FIGS. 8A-8E, there are shown schematic cross-sectional side view representations for illustrating a method for fabricating an electronic device according to an embodiment. In the following only differences with respect to the method as illustrated in FIGS. 7A-7F are explained in detail. The placing of the semiconductor chips 1 onto a carrier 100 as shown in FIG. 8A is analogous to that one as shown in FIG. 7A. Thereafter, as shown in FIG. 8B, a barrier layer 6 like, for example Ti/TiN or Ti/W or Ti, is deposited onto the semiconductor chips 1 and intermediate spaces between them. FIG. 8C shows the arrangement after removing of the barrier layer 6 from the intermediate spaces by means of anisotropic etching so that, as a result, the barrier layer 6 remains on the side faces 1C and the second main faces 1B of the semiconductor chips 1. The steps as shown in FIG. 8D-8E are then analogous to the steps as shown and described in FIGS. 7D-7F. As a result electronic devices are obtained in which the interdiffusion prevention layer is comprised as a barrier layer 6 covering the side faces 1C and the second main face 1B of the semiconductor chip 1.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. An electronic device comprising:
    a semiconductor chip comprising a first main face, a second main face, and side faces each connecting the first main face to the second main face;
    an interdiffusion prevention layer directly disposed on the second main face and the side faces, wherein the interdiffusion prevention layer comprises a single Ti layer or a layer stack comprising two or more layers of Ti and a Ti alloy; and
    a metal layer directly disposed on the interdiffusion prevention layer, wherein the metal layer comprises an upper horizontal portion disposed above the second main face, a vertical portion disposed above the side faces, and a lower horizontal portion extending in a plane of the first main face, and wherein the lower horizontal portion is shaped in a form of a closed ring surrounding the semiconductor chip, wherein the metal layer is a porous metal layer.

2. The electronic device according to claim 1, wherein the semiconductor chip has a first contact element on the first main face and a second contact element on the second main face, and wherein the metal layer is electrically connected to the second contact element.

3. The electronic device according to claim 2, wherein the semiconductor chip further comprises a third contact element on the first main face, wherein the first contact element is a gate contact, the second contact element is a drain contact and the third contact element is a source contact.

4. The electronic device according to claim 1, further comprising a ring-shaped field-limiting layer disposed on the first main face of the semiconductor chip, the ring-shaped field-limiting layer being located at an edge of the semiconductor chip.

5. The electronic device according to claim 4, wherein a lower surface of the ring-shaped field-limiting layer and a lower surface of the interdiffusion prevention layer are substantially coplanar.

6. The electronic device according to claim 1, wherein the porous metal layer comprises elemental copper having a porous structure with a porosity of 2% to 40%.

7. An electronic device comprising:
a semiconductor chip comprising a first main face, a second main face, and side faces each connecting the first main face to the second main face;
an interdiffusion prevention layer directly disposed only on the side faces, wherein the interdiffusion prevention layer comprises a single Ti layer or a layer stack comprising two or more layers of Ti and a Ti alloy; and
a metal layer directly disposed on the interdiffusion prevention layer and the second main face, wherein the metal layer comprises an upper horizontal portion disposed above the second main face, a vertical portion disposed above the side faces, and a lower horizontal portion extending in a plane of the first main face, and wherein the lower horizontal portion is shaped in a form of a closed ring surrounding the semiconductor chip, wherein the metal layer is a porous metal layer.

8. The electronic device according to claim 7, wherein the semiconductor chip has a first contact element on the first main face and a second contact element on the second main face, and wherein the metal layer is directly electrically connected to the second contact element.

9. The electronic device according to claim 8, wherein the semiconductor chip further comprises a third contact element on the first main face, wherein the first contact element is a gate contact, the second contact element is a drain contact and the third contact element is a source contact.

10. The electronic device according to claim 7, further comprising a ring-shaped field-limiting layer disposed on the first main face of the semiconductor chip, the ring-shaped field-limiting layer being located at an edge of the semiconductor chip.

11. The electronic device according to claim 10, wherein a lower surface of the ring-shaped field-limiting layer and a lower surface of the interdiffusion prevention layer are substantially coplanar.

12. The electronic device according to claim 7, wherein the porous metal layer comprises elemental copper having a porous structure with a porosity of 2% to 40%.

\* \* \* \* \*